US006784815B2

(12) United States Patent
Jonsson

(10) Patent No.: US 6,784,815 B2
(45) Date of Patent: Aug. 31, 2004

(54) A/D CONVERTER WITH ADAPTIVE BACKGROUND CALIBRATION SKIP RATE

(75) Inventor: Bengt Erik Jonsson, Spånga (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 10/372,716

(22) Filed: Feb. 25, 2003

(65) Prior Publication Data

US 2003/0169192 A1 Sep. 11, 2003

Related U.S. Application Data

(63) Continuation of application No. PCT/SE01/01802, filed on Aug. 24, 2001.

(30) Foreign Application Priority Data

Mar. 14, 2000  (SE) ............................................... 0000843
Aug. 29, 2000  (SE) ............................................... 0003043
Jun. 12, 2001  (SE) ............................................... 0102078

(51) Int. Cl.$^7$ ................................................ H03M 1/10
(52) U.S. Cl. ....................... 341/120; 341/156; 341/155; 341/118
(58) Field of Search ................................ 341/120, 156, 341/158, 155, 118, 159, 143, 144

(56) References Cited

U.S. PATENT DOCUMENTS

| 5,499,027 | A  |   | 3/1996  | Karanicolas et al. |         |
|-----------|----|---|---------|--------------------|---------|
| 6,414,612 | B1 | * | 7/2002  | Quesenberry        | 341/120 |
| 6,473,012 | B2 | * | 10/2002 | Hellberg et al.    | 341/120 |
| 6,496,125 | B2 | * | 12/2002 | Jonsson et al.     | 341/118 |

FOREIGN PATENT DOCUMENTS

EP   0 981 204 A2   2/2000

OTHER PUBLICATIONS

Erdoğan et al, "A 12b Digital–Background–Calibrated Algorithmic ADC with −90dB THD", ISSCC99/Session 18, PaperWA 18.1, 1999 IEEE Internatonal Solid–State Circuits Conference, pp. 316–317, 473.

Moon et al, "Background Digital Calibration Techniques for Pipelined ADC's", IEEE Transactions on Circuits and Systems–II; Analog and Digital Signal Processing, vol. 44, No. 2, Feb. 1997, pp. 102–109.

Kwak et al, "A 15–b, 5–Msample/s Low–Spurious CMOS ADC", IEEE Journal of Solid–State Circuits, vol. 32, No. 12, Dec. 1997, pp. 1866–1875.

Razavi, "Design of Analog CMOS Integrated Circuits" Preview Edition.

International Search Report mailed Dec. 10, 2001 in corresponding PCT application No. PCT/SE01/01802.

International Preliminary Examination Report completed Jul. 16, 2002 in corresponding PCT application No. PCT/SE01/01802.

* cited by examiner

Primary Examiner—Michael Tokar
Assistant Examiner—Lam T Mai
(74) Attorney, Agent, or Firm—Nixon & Vanderhye, P.C.

(57) ABSTRACT

An A/D converter calibration apparatus of the "skip-and-fill" type includes a set of operating condition parameter sensors (100) for detecting the current operating conditions, which are represented by parameters $x_1, \ldots, x_N$. The measured parameter are forwarded to an operating conditions change detector (102), which calculates a change measure and determines whether this measure exceeds or falls below a predetermined change threshold. A calibration control signal CTRL_SKIP_RT is passed to a calibration control unit (104), which sets the background calibration skip rate to a high value if the measure exceeds the threshold an to a low value if it does not exceed the threshold.

20 Claims, 8 Drawing Sheets

TEMPERATURE SENSOR
(VOLTAGE-BASED)

TEMPERATURE SENSOR
(CURRENT-BASED)

BIAS CURRENT SENSOR

SUPPLY VOLTAGE SENSOR

A/D CONVERTER WITH ADAPTIVE BACKGROUND CALIBRATION SKIP RATE

This application is a continuation of international application PCT/SE01/01802 filed Aug. 24, 2001 which designates the U.S.

TECHNICAL FIELD

The present invention relates to analog-to-digital (A/D) converters, and in particular to background calibration of such converters.

BACKGROUND

The performance of any A/D converter is limited by non-ideal effects associated with its various building blocks. The influence of several such effects can be addressed by digital calibration, e.g. as described in [1], where a set of digital calibration coefficients are used to correct the estimated analog circuit errors. A problem is that the calibration coefficients are most accurate when the circuit is operated under exactly the same conditions as when the coefficients were estimated. If, for example, the temperature, the supply voltage, or a bias current is changed, a new set of coefficients may be required for optimal error correction.

Usually, a technique called background calibration [2] is used to continuously calibrate the A/D converter during normal operation. However, the background calibration process disturbs the normal signal flow through the A/D converter, and therefore causes an error in the output. There are techniques to reduce the magnitude of such errors, e.g. by interpolation as described in [3]. During a background calibration sequence this "skip-and-fill" method creates time slots for calibration by interrupting sampling for every $k^{th}$ sample position and inserting an interpolated sample into the output stream. Such calibration sequences are continuously repeated. Nevertheless, the interpolated samples produced by the background calibration of the A/D converter lead to an increased bit-error rate in, for example, digital communication systems. It would be desirable, both from a signal quality and power efficiency point of view, to suppress background calibration of the A/D converter as much as possible.

SUMMARY

An object of the present invention is to provide background calibration techniques for A/D converters at a lower bit-error rate penalty than in the prior art.

This object is achieved in accordance with the attached claims.

Briefly, the present invention is based on the insight that background calibration is normally not necessary during times when operating conditions are stable. By using on-chip or off-chip sensors for critical operating parameters, such as temperature and supply voltage, it becomes possible to track changing operating conditions and to decrease the sample skip rate of the background calibration under stable conditions, thus lowering the bit-error rate in steady-state. A further advantage of this approach is that tracking of operating conditions also gives the possibility of increasing the skip rate if these conditions are changing very rapidly. In this situation it may be better to slightly increase the error level caused by background calibration in order to obtain a constantly calibrated converter.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
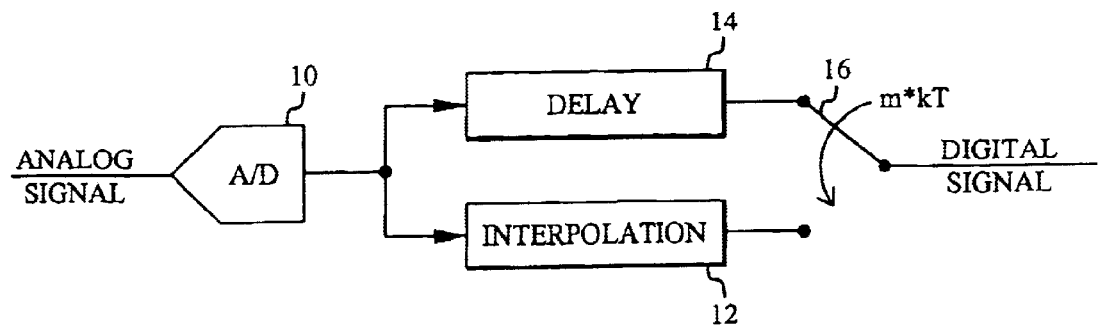
FIG. 1 is a block diagram of a conventional A/D converter with an inter-polator.
Figure 2:
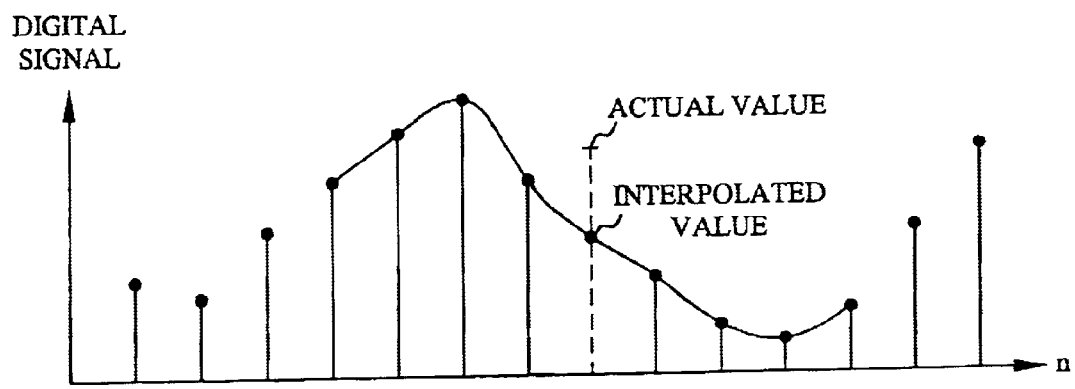
FIG. 2 is a time diagram illustrating sampling with the A/D converter of FIG. 1.

One of the more popular approaches to background calibration is to use the "skip-and-fill" approach [3, 4], as illustrated in FIGS. 1 and 2.

FIG. 1 is a block diagram of a conventional A/D converter with an interpolator. An analog signal is forwarded to an A/D converter 10. The digital samples are forwarded to an interpolator 12 and a delay element 14. A switch 16 is normally in the indicated upper position, in which the digital samples from delay element 14 are outputted at a sampling interval T. Every $k^{th}$ sample switch 16 is forced to its lower position, in which a sample is skipped and an interpolated digital sample from interpolator 12 is outputted instead. Thereafter switch 16 returns to its upper position. Calibration, or a part of a complete calibration of A/D converter 10 is performed during the interpolation. This operation is repeated periodically.

FIG. 2 is a time diagram illustrating sampling with the A/D converter of FIG. 1. The dashed line denotes the actual value of the skipped sample. Due to the limited bandwidth of the interpolation, the interpolated value may be different from this actual value. The interpolated value lies on the illustrated interpolation curve that is formed by surrounding samples. These surrounding samples are the reason for delay element 14 in FIG. 1 (in order to be able to interpolate, samples are required both before and after the skipped sample).

Figure 3:
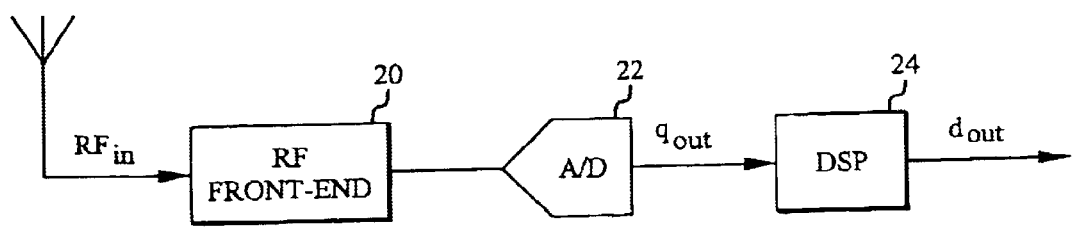
FIG. 3 is a simplified block diagram of a typical digital radio system.

A digital radio system example is shown in FIG. 3. An analog radio frequency (RF) signal is received and converted to baseband by means of a RF front end 20. The baseband signal is then digitized by an A/D converter 22, and further processed in digital form by a digital signal processing (DSP) unit 24. The transmission quality can be measured in terms of the bit-error rate (BER) of the digital output signal $d_{out}$. Transmission quality is usually limited by the performance of the RF front end and the A/D converter.

Figure 4:
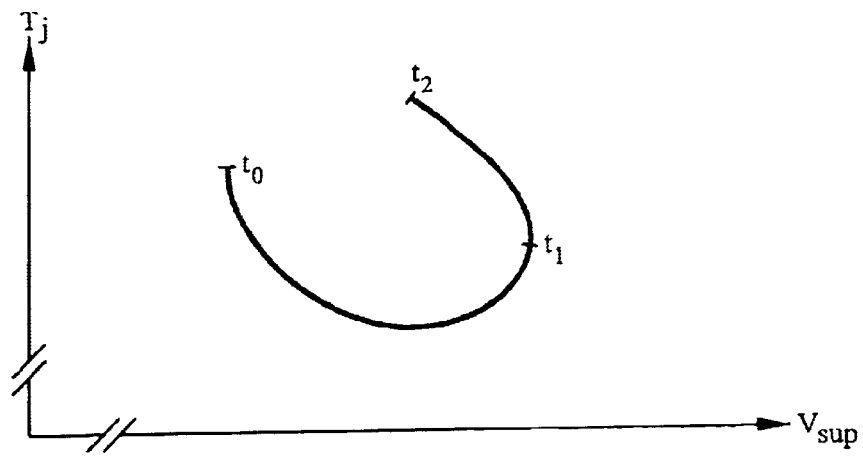
FIG. 4 is a diagram illustrating how operating conditions may change over time.

The A/D-converter performance is influenced by a combination of static errors, such as component mismatch, and a number of parameters representing its operating conditions. Examples of such parameters are temperature, supply voltage, and bias currents. Since an operating range is usually defined for each parameter, a one-dimensional or multi-dimensional operating space is formed. As an example, the two-dimensional operating space for junction temperature $T_j$, and supply voltage $V_{sup}$, is shown in FIG. 4. A simultaneous change in these two parameters over time is illustrated by the curve (time increases from $t_0$ to $t_2$).

The influence of component mismatch and fluctuating operating conditions can be reduced, e.g. by digital calibration. A problem is that efficient digital calibration of A/D-converters requires calibration coefficients to be updated whenever operating conditions have changed. Such re-calibration can be done in the foreground or in the background.

Foreground calibration completely blocks the data flow through the A/D converter until the calibration sequence is completed. In a digital radio system, this would stop all traffic during the entire calibration sequence. Such interrupts are unacceptable in any normal mode of operation, and thus foreground calibration can only be used at start-up or when the A/D converter is off-line. Background calibration is therefore used in the prior-art to solve this problem.

Background calibration also disturbs the signal flow in the A/D converter, although not as much as foreground calibration does. The loss in signal quality is a function of the accuracy of the fill samples, and the spacing between them. A larger fill sample spacing (or a lower skip rate) results in less error energy in a sample sequence of a certain length However, if the fill sample spacing is too large, the background calibration will not efficiently track rapid changes in operating conditions.

Figure 5:
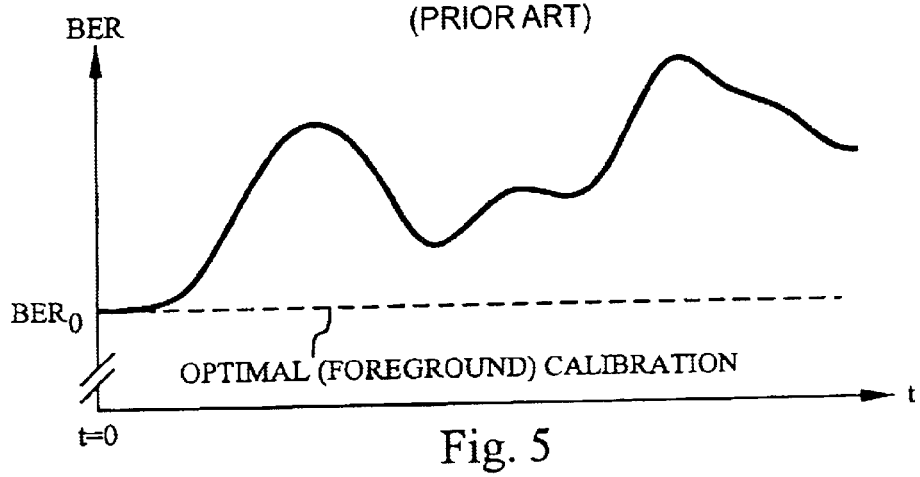
FIG. 5 is a time diagram illustrating the behavior of the system level bit-error rate after an initial A/D converter foreground calibration.
Figure 6:
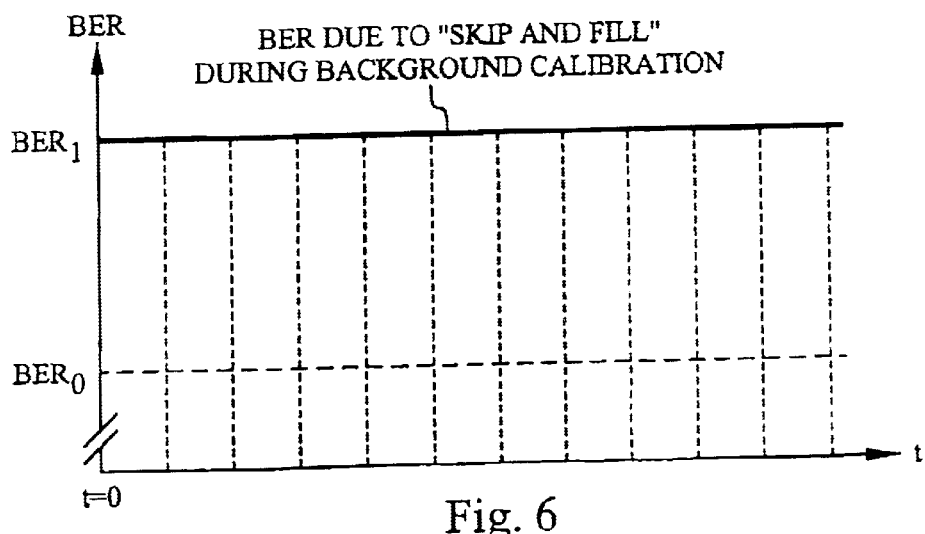
FIG. 6 is a time diagram illustrating the behavior of the system level bit-error rate when using AID converter background calibration.

The difference between foreground and background calibration from a system-level point-of-view is illustrated in FIGS. 5 and 6.

A foreground calibration approach can find the optimal set of calibration coefficients at start-up (t=0). This is represented at system level by the low bit error rate $BER_0$. As operating conditions change over time, so does the bit-error rate, and this uncontrolled variation can be fairly large as indicated in FIG. 5.

Figure 7:
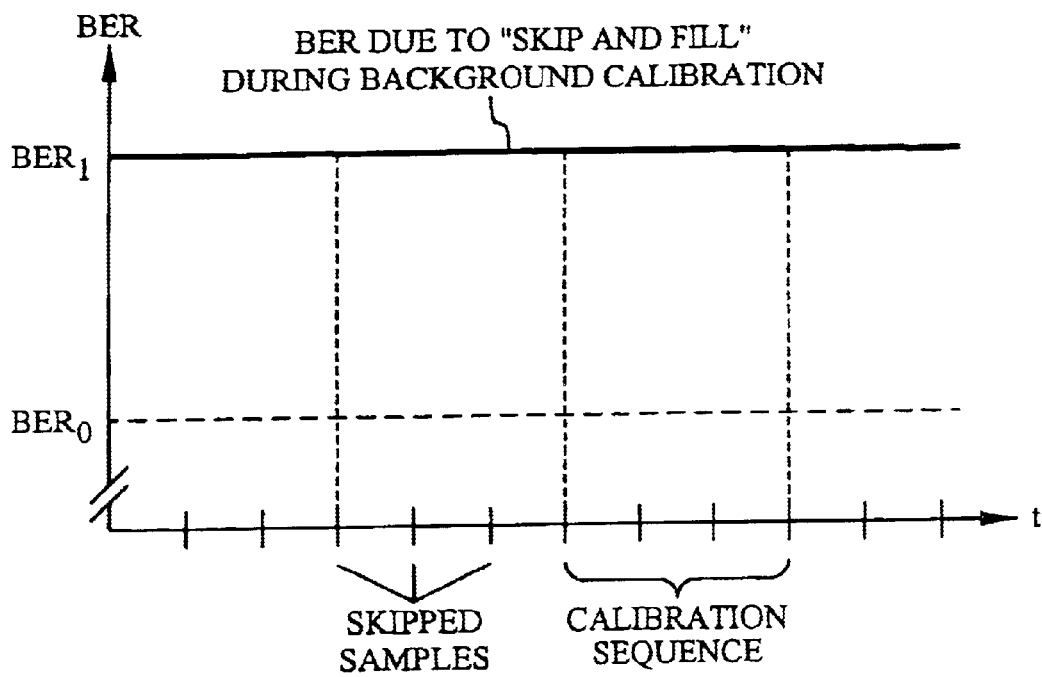
FIG. 7 is an expanded view of the diagram in FIG. 6.

Background calibration involves continuously repeating a calibration sequence, in which A/D conversion is interrupted for a predetermined number of sample positions and the skipped samples are replaced by fill samples, which are typically obtained by interpolation. Using a relatively dense background calibration sequence (high skip rate) can stabilize the bit error rate even under rapid changes in operating conditions. This is illustrated in FIG. 6, where the bit-error rate is essentially constant. FIG. 7 is an expanded view of the diagram in FIG. 6, in which the skipped samples are illustrated by tick marks (between these samples there are k−1 regular samples) and the length of a calibration sequence has been indicated. Due to the "skip-and-fill" operation in background calibration, there is an increase in the lowest attainable bit-error rate—from the optimum $BER_0$ to $BER_1$—determined by the density or skip rate of the background calibration sequence and the accuracy of the fill samples.

In the prior art, the background calibration sequence is continuously repeated with constant skip rate, whether it is needed or not. However, under stable operating conditions, there is actually less need to continuously recalibrate the A/D converter. Although the fill sample error can be made small, it still represents an unnecessary A/D-conversion error. Therefore background calibration should be suppressed as much as possible when operating conditions are stable.

The present invention solves the problems with continuous background calibration by tracking the changes in operating conditions and adapting background calibration skip rate to the operating conditions change rate.

Figure 8:
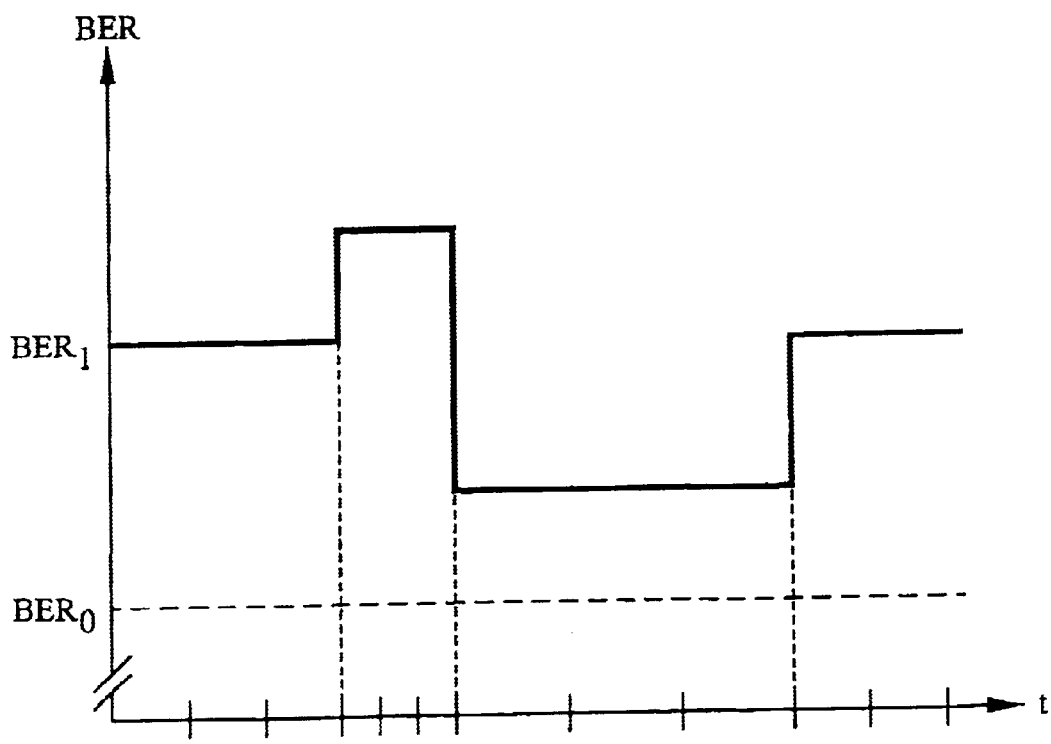
FIG. 8 is a time diagram illustrating the behavior of the system level bit-error rate at different skip rates.

FIG. 8 is diagram corresponding to FIG. 7 illustrating the principles of the present invention. The first calibration sequence is the same as in FIG. 7, and thus has the bit-error rate $BER_1$. The second calibration sequence is compressed, i.e. the skip rate h been increased, as indicated by the reduced spacing between the tick marks. This implies an increased bit-error rate, but also a better tracking of rapidly changing operating conditions. The third calibration sequence in FIG. 8 is expanded, i.e. the skip rate has been decreased, as indicated by the increased spacing between the tick marks. This implies a reduced bit-error rate, at the price of a reduced ability to track fast changes in operating conditions. Thus, expanded calibration sequences are suitable during periods of stable operating conditions.

Figure 9:
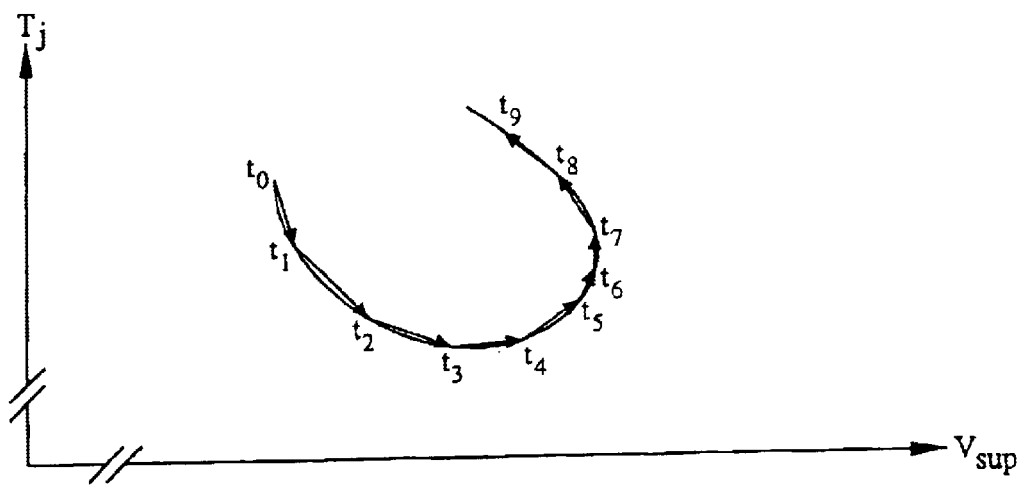
FIG. 9 is a diagram illustrating an exemplary method of tracking changes in operating conditions.

From the discussion above it is appreciated that tracking of changes in operating conditions is an essential step in controlling bit-error rate. FIG. 9 is a diagram illustrating an exemplary method of tracking such changes. Each operating condition parameter is considered as a vector component, and each vector in FIG. 9 represents the change in operating conditions since the last calibration sequence (the calibration sequences start at instants $t_0$–$t_9$). A suitable measure for the overall change in operating conditions during a calibration sequence may be expressed as the magnitude of such a difference vector.

There are several possible ways to define the magnitude of a difference vector. One possibility is $$\Delta x = \sqrt{\sum_{i=1}^{N} c_i (\Delta x_i)^2}$$

where
  $\Delta x$ is the magnitude of the difference vector,
  $\Delta x_i$ are the changes in operating condition parameters,
  N is the number of operating condition parameters, and
  $c_i$ are weighting coefficients that account for the relative importance of different parameters.

Another possibility is $$\Delta x = \sum_{i=1}^{N} c_i |\Delta x_i|$$

Still another possibility is $$\Delta x = \max_{i}(c_i |\Delta x_i|)$$

In the last mentioned example the largest (weighted) magnitude of a component represents the overall change.

Figure 10:
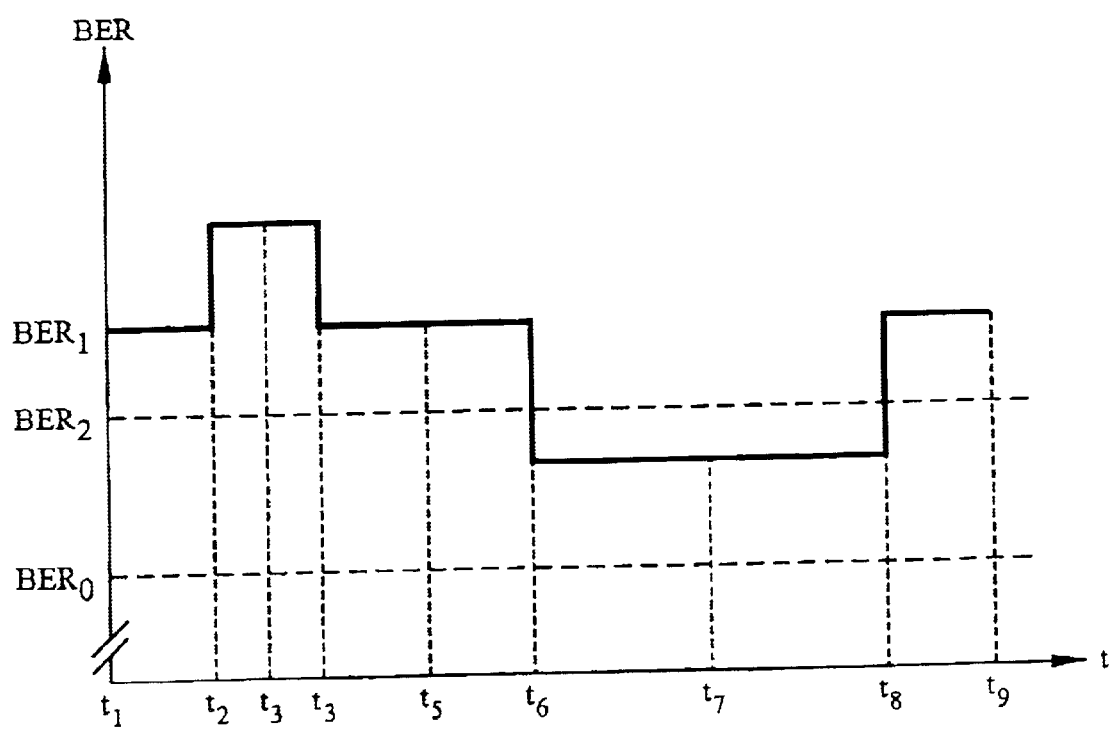
FIG. 10 is a time diagram illustrating the behavior of the system level bit-error rate in an exemplary embodiment of the present invention.

FIG. 10 is a time diagram illustrating the behavior of the system level bit-error rate in an exemplary embodiment of the present invention. In this embodiment the skip rate is increased to a higher rate if the measure representing the change in operating conditions during a calibration sequence exceeds a MAX value. On the other hand, the skip rate is decreased to a lower rate if the measure falls below a MIN value. If the measure lies between the MAX and MIN values, the standard skip rate is used.

In FIG. 9 the first difference vector between $t_0$ and $t_1$ is assumed to lie between the MAX and MIN values. Thus, the first calibration sequence between $t_1$ and $t_2$ in FIG. 10 will generate the "normal" bit-error rate $BER_1$. During this calibration sequence the operating conditions have changed more rapidly, as can be seen by the longer difference vector between $t_1$ and $t_2$ in FIG. 9. It is assumed that this longer vector has a magnitude that exceeds the MAX value. Thus, the skip rate will be increased and the calibration sequence between $t_2$ and $t_3$ in FIG. 10. As can be seen in FIG. 10 this also raises the bit-error rate above $BER_1$. The next difference between $t_2$ and $t_3$ in FIG. 9 also exceeds the MAX value in length, and therefore the next calibration sequence between $t_3$ and $t_4$ in FIG. 10 will also be compressed. Between $t_6$ and $t_8$, the calibration sequence is again expanded to normal skip rate, due to normal length difference vectors between $t_5$ and $t_7$ in FIG. 9. Between $t_5$ and $t_7$ in FIG. 9 there are only small changes in operating conditions, and thus only short difference vectors with a magnitude less than the MIN value. This implies that there will be expanded calibration sequences with a lower than normal skip rate between $t_6$ and $t_8$ in FIG. 10. From this description it is appreciated that if operating conditions change slowly most of the time, the average bit-error rate $BER_2$ will lie between $BER_0$ and $BER_1$.

A complication in the procedure described with reference to FIGS. 9 and 10 is that the difference vectors represent changes over non-equal time periods if the calibration sequences do not have the same skip rate. A possible solution is to multiply change measures obtained from non-normal sequences by a time compensating scale factor. In this way all measures will refer to the same time period. Another possibility is to have different MAX and MIN values for normal and non-normal sequence lengths, thereby including the time compensation directly in the MAX and MIN values.

An alternative to measuring the change in operating condition parameters at the end of each calibration sequence is to perform the measurements on a regular basis. In this way the measurement time period will always be the same. This time period may, for example, be equal to a normal length calibration sequence. The measured change during such a time period will influence the skip rate of the next calibration sequence, although this sequence may not start exactly when the measurement was completed. However, it is also possible to change the skip rate within a calibration sequence (and not wait until the next sequence starts).

Figure 11:
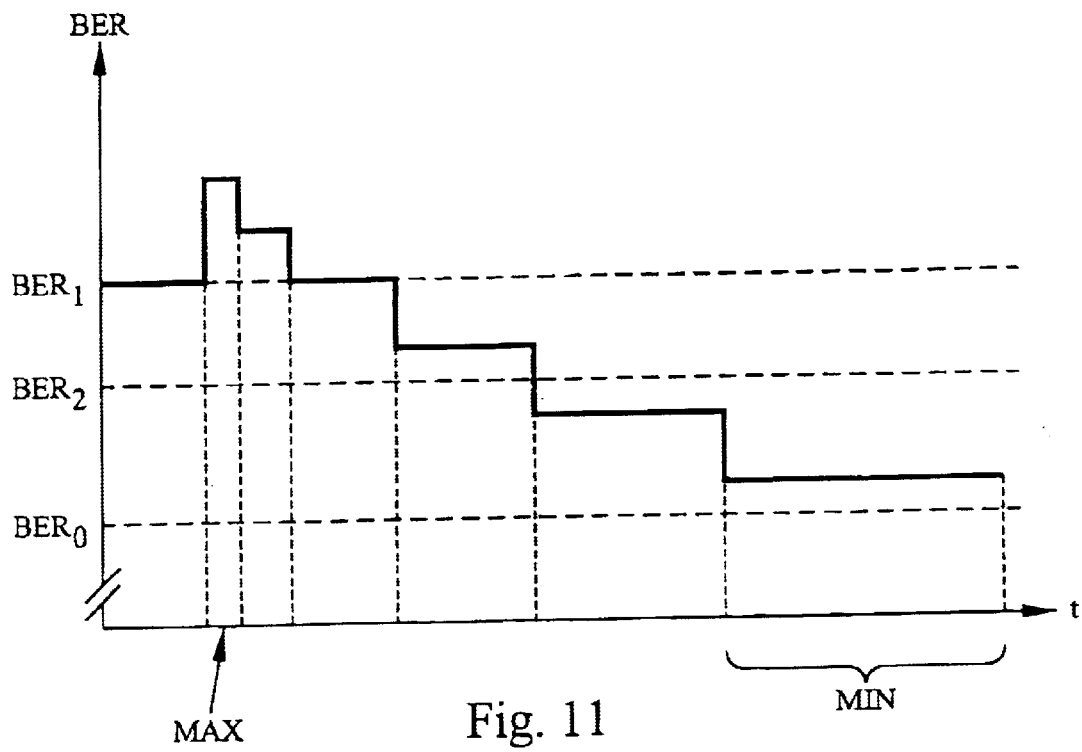
FIG. 11 is a time diagram illustrating the behavior of the system level bit-error rate in another exemplary embodiment of the present invention.

Another embodiment of the invention includes more possible skip rates. In this embodiment the skip rate is increased as long as the change measure from the previous calibration sequence exceed the MAX value, until an upper skip rate limit is reached. Similarly, the skip rate is decreased as long as the change measure from the previous calibration sequence falls below the MIN value, until a lower skip rate limit is reached. Finally, as long as the change measure from the previous calibration sequence lies between the MAX and MIN values, the skip rate is increased or decreased, depending on whether the previous skip rate was lower or higher than the normal skip rate, until the normal skip rate is reached. FIG. 11 illustrates the typical behavior of this embodiment.

In a simplified embodiment there is only one change threshold. If the threshold is exceeded, a higher skip rate is selected. If the change rate falls below the threshold, a lower skip rate is selected.

Figure 12:
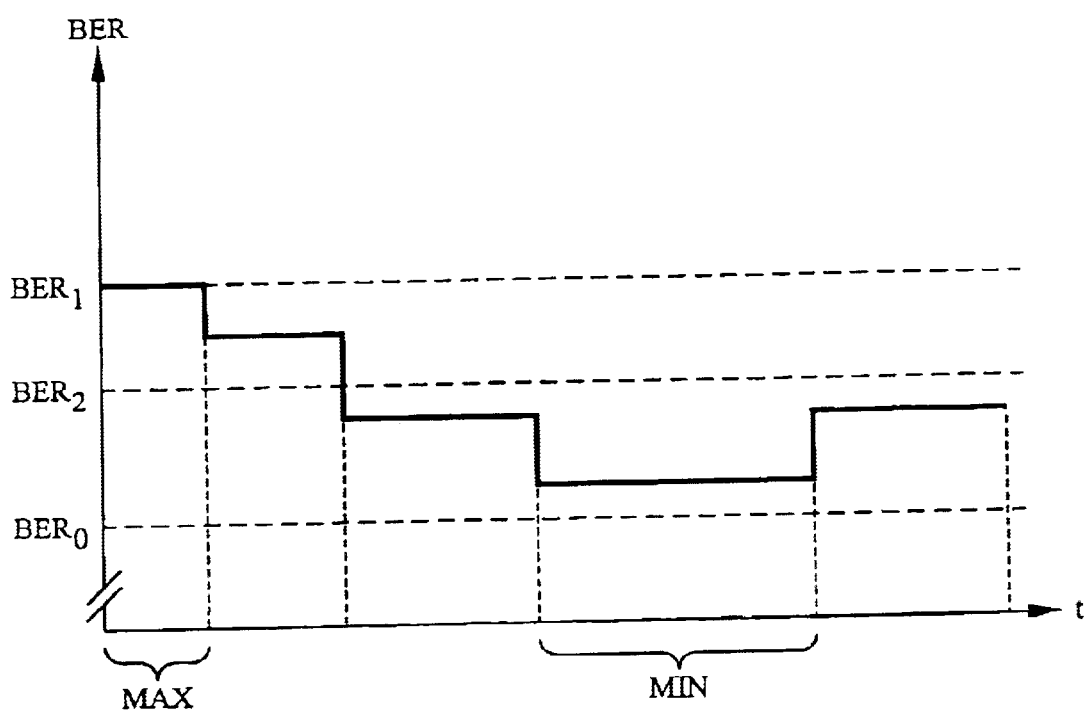
FIG. 12 is a time diagram illustrating the behavior of the system level bit-error rate in a further exemplary embodiment of the present invention.

The embodiment of the preceding paragraph can also be extended to include further skip rates between the higher and lower skip rates. If the threshold is exceeded, a higher skip rate is selected until a maximum skip rate is reached. If the change rate falls below the threshold, a lower skip rate is selected until a minimum skip rate is reached. FIG. 12 illustrates the typical behavior of this embodiment.

Instead of gradually increasing or decreasing the skip rate, it is also possible to select a skip interval k that is essentially proportional to the inverse of the change rate, for example $$k = \text{ROUND}\left(\alpha \cdot \frac{\Delta t}{\Delta x}\right)$$

More generally the skip interval could be a function of $\Delta x$ and $\Delta t$.

Figure 13:
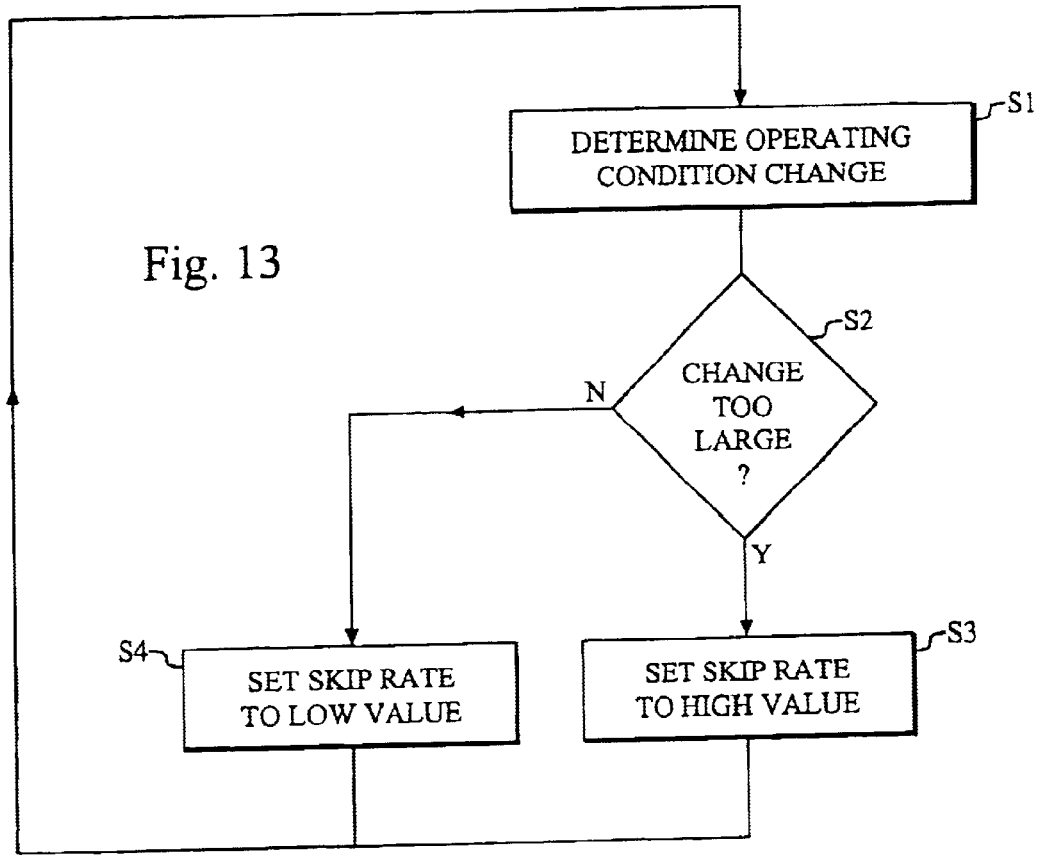
FIG. 13 is a flow chart illustrating an exemplary embodiment of the A/D converter calibration method in accordance with the present invention.

FIG. 13 is a flow chart illustrating an exemplary embodiment of the method of the present invention. Step S1 determines the change in operating conditions by determining and combining the operating parameter changes, for example in accordance with one of the equations above. Step S2 determines whether the change exceeds a predetermined threshold. If this is the case, step S3 sets the skip rate of the next calibration sequence to the high rate. Otherwise step S4 sets the skip rate to the low rate. After step S3 o S4 the procedure returns to step S1. Steps S1 and S2 are performed at the end of each calibration sequence.

Figure 14:
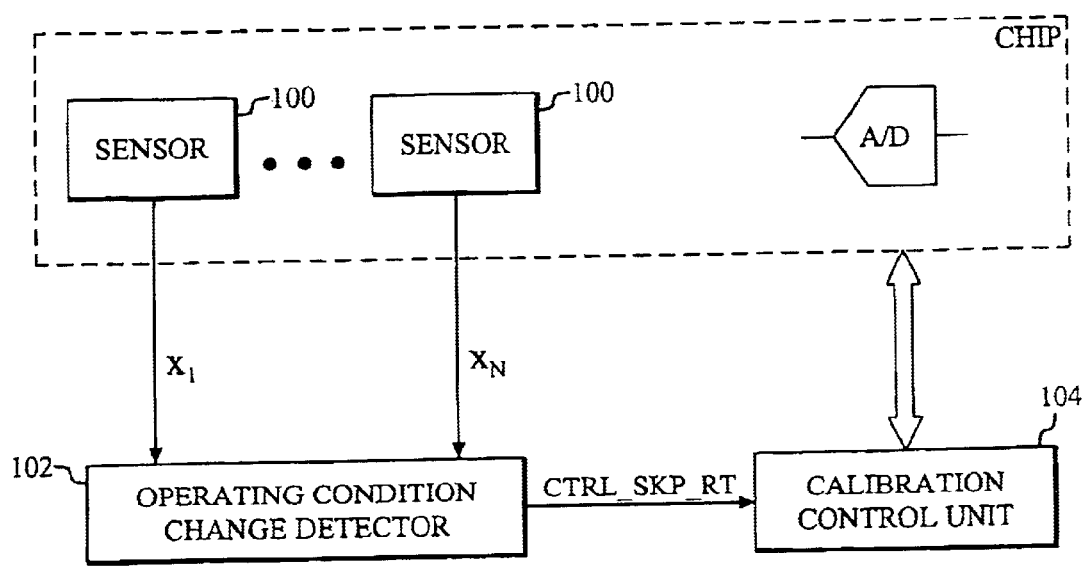
FIG. 14 is a block diagram illustrating an exemplary embodiment of an A/D converter calibration apparatus in accordance with the present invention.

FIG. 14 is a block diagram illustrating an exemplary embodiment of an A/D converter calibration apparatus in accordance with the present invention. A set of operating condition parameter sensors 100 detect the current operating conditions, which are represented by parameters $x_1, \ldots, x_N$. In this embodiment the sensors 100 are assumed to be integrated on the same chip as the A/D converter itself. However, embodiments where some or all sensors are provided separately from the chip are also feasible. The measured parameter are forwarded, in analog or digital form, to an operating conditions change detector 102, which determines a change measure, for example in accordance with one of the above equations, and determines whether this measure exceeds a predetermined change threshold. A calibration control signal CTRL_SKP_RT is passed to a calibration control unit 104, which sets the skip rate of the next background calibration sequence to a high or low value, depending on whether the determined change measure exceeded the threshold or not. In the embodiment of FIG. 10 change detector 102 and control unit 104 are illustrated as being outside of the A/D converter chip. However, embodiments where one or both of these elements are integrated with the A/D converter itself are equally feasible. When placed outside the A/D converter chip, change detector 102 may be implemented using a micro processor, signal processor or field-programmable gate-array (FPGA). When placed on the chip, it may be implemented as an application-specific digital circuit.

Since there is actually no need to accurately detect absolute parameter values, the operating conditions can be detected with simple on-chip or off-chip devices, having a low power dissipation. The only requirement is that relative changes can be detected with sufficient resolution and speed. As an example, assume that temperature changes of 0.1° C. or less are to be detected within a temperature range of 0–90° C. It is then possible to use a 10 bit A/D converter for a nominal quantization range of −5 to +95° C. This corresponds to a temperature resolution of 0.1° C. A possible displacement of the temperature scale of a few ° C. due to, for example, variations in the production of the sensors is normally acceptable.

Figure 15:
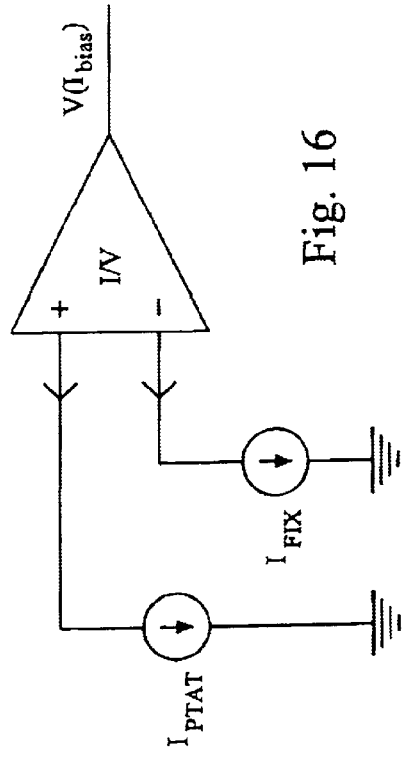
FIG. 15 illustrates an exemplary embodiment of a junction temperature sensor.

FIG. 15 illustrates an exemplary embodiment of a junction temperature sensor. In this embodiment temperature is detected by a voltage reference $V_{PTAT}$ that is "Proportional To Absolute Temperature" (PTAT) and a voltage reference $V_{FIX}$ that is independent of temperature and possible also of supply voltage.

Figure 16:
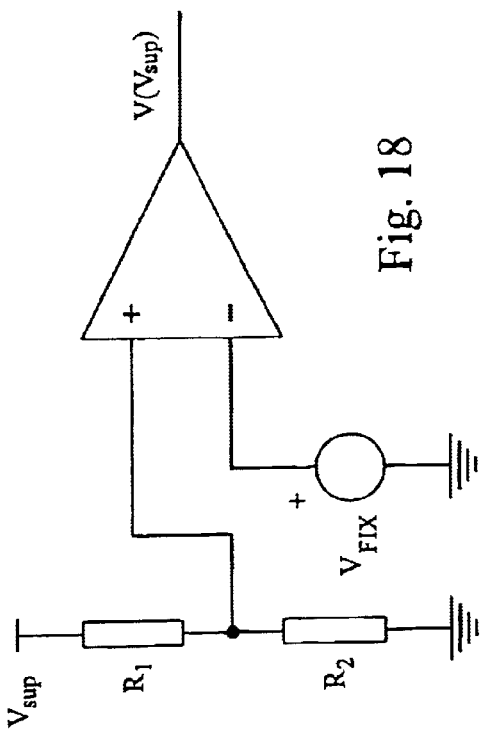
FIG. 16 illustrates another exemplary embodiment of a junction temperature sensor.

FIG. 16 illustrates another exemplary embodiment of a junction temperature sensor. In this embodiment the voltage references in FIG. 15 have been replaced by corresponding current references.

Figure 17:
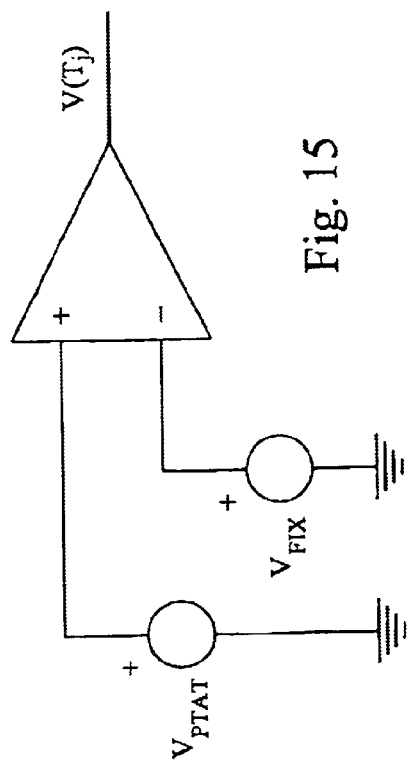
FIG. 17 illustrates an exemplary embodiment of a bias current sensor.

FIG. 17 illustrates an exemplary embodiment of a bias current sensor. In this embodiment bias current variations may be detected by comparing a copy of the monitored bias current to a constant reference current.

Figure 18:
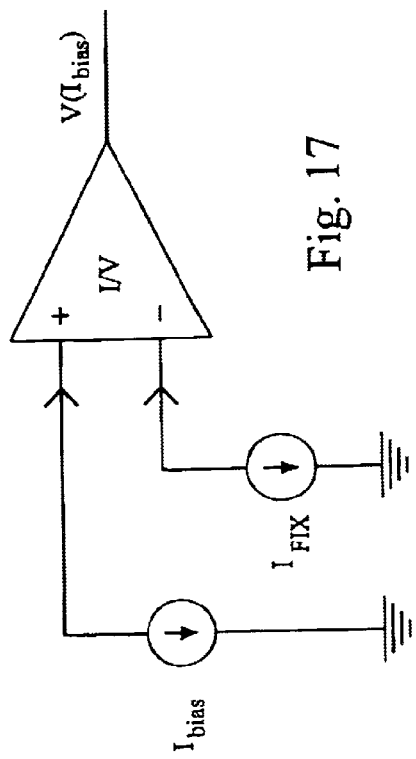
FIG. 18 illustrates an exemplary embodiment of a supply voltage sensor.

FIG. 18 illustrates an exemplary embodiment of a supply voltage sensor. In this embodiment voltage variations are detected by dividing the supply voltage over two resistors and comparing the resulting divided voltage to a constant reference voltage, for example from a band gap reference of 1.25 V.

Further details on implementation of the sensor embodiments described with reference to FIG. 15–18 may be found in [5], which describes PTAT and constant voltages and currents in detail.

Figure 19:
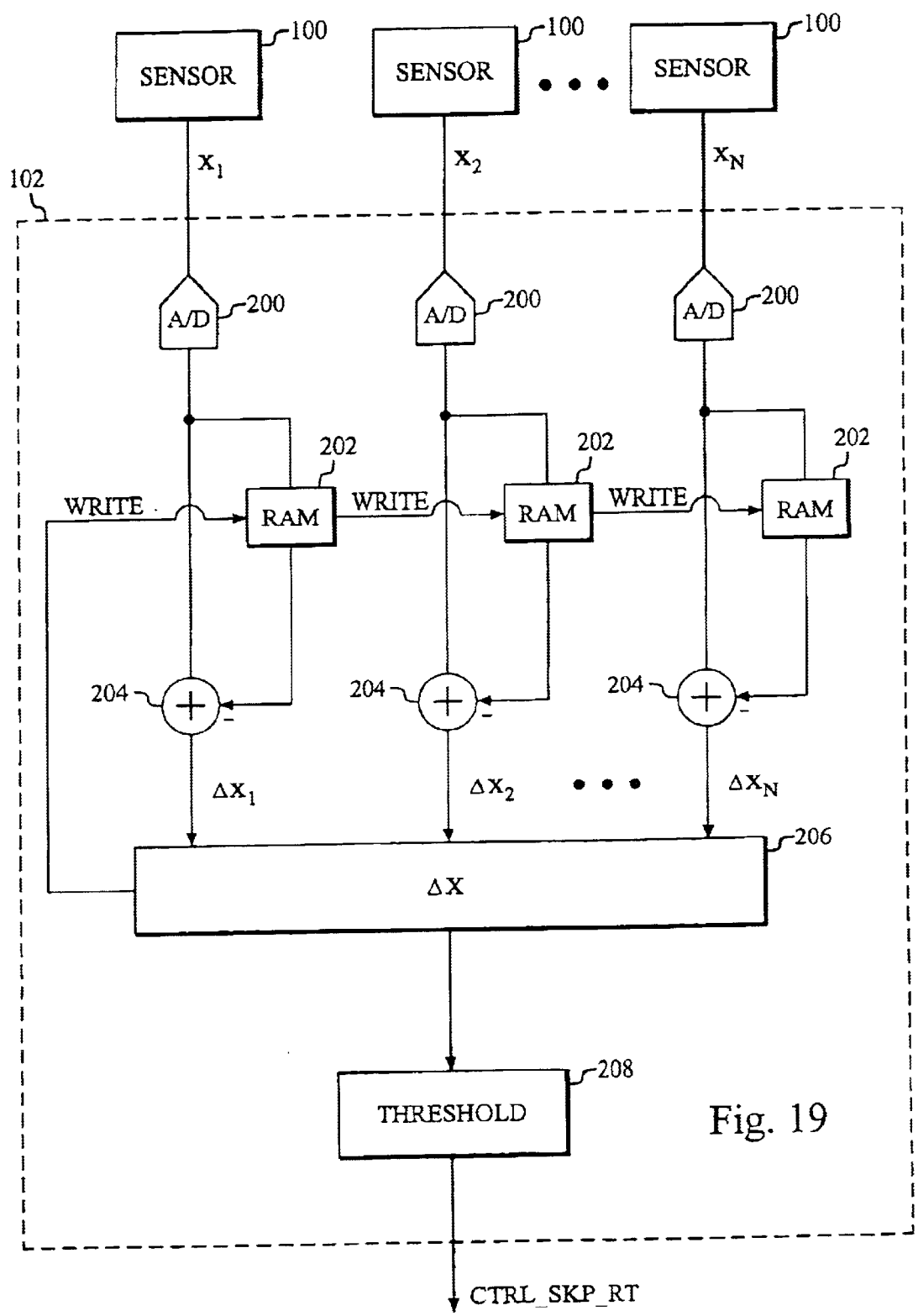
FIG. 19 is a block diagram illustrating an exemplary embodiment of an operating condition change detector.

FIG. 19 is a block diagram illustrating an exemplary embodiment of an operating condition change detector. The measured parameter values from sensors 100 are forwarded to a set of A/D converters 200. The digitized values are forwarded to RAM cells 202 and to adders 204. Adders 204 form the differences between the measured parameter values and the value stored in RAM cells 202 at the previous calibration start. A unit 206 determines a change measure, for example in accordance with one of the equations above. This change measure is forwarded to a threshold unit 208. If the change measure exceeds the threshold, a CTRL_SKP_RT signal selects a higher skip rate. Otherwise it selects a lower skip rate. Unit 206 also generates a signal that enables writing of the current sensor values into RAM cells 202 each time a change value has been determined.

In order to reduce the influence of noise and glitches, and to generally improve the accuracy of estimated calibration coefficients, averaging of coefficients from multiple calibration sequences may be used to statistically refine the calibration.

One of the advantages of the present invention over prior art is that it allows controlled background calibration. By reducing the background calibration skip rate when operating conditions are stable, the signal flow through the A/D converter is interrupted less often, and therefore the bit-error rate is improved.

Another advantage is that a low background calibration skip rate saves power. This feature is especially attractive in battery powered equipment, such as mobile terminals.

The invention represents a generic method, applicable to background calibration of most known A/D converter architectures, and therefore covers a large number of applications, not only those related to digital radio systems.

The present invention is not limited to a particular calibration scheme. Instead, by using the present invention it becomes possible to improve the overall system performance while using one of a wide range of novel and existing background calibration schemes.

Furthermore, the present invention is not limited to the interpolation-type skip-and-fill background calibration used for illustration. It is equally applicable to any background calibration that occasionally disturbs the data-flow through the main conversion path. As an example, it is possible to use a lower performance auxiliary A/D converter for sampling the samples that are skipped by the main A/D converter.

It will be understood by those skilled in the art that various modifications and changes may be made to the present invention without departure from the scope thereof, which is defined by the appended claims.

References

[1] U.S. Pat. No. 5,499,027, A. N. Karanicolas, and H.-S. Lee, "Digitally self-calibrating pipeline analog-to-digital converter".

[2] O. E. Erdogan, P. J. Hurst, and S. H. Lewis, "A 12b Digital-Background-Calibrated Algorithmic ADC with −90 dB THD", 1999 *Intl. Solid-State Circ. Conf.*, pp. 316–317, February 1999, IEEE.

[3] U.-K. Moon, and B.-S. Song, "Background Digital Calibration Techniques for Pipelined ADC's", *IEEE Trans. Circ. Syst.-II*, pp. 102–109, Vol. 44, No. 2, February 1997, IEEE.

[4] S.-U. Kwak, B.-S. Song, and K. Bacrania, "A 15-b, 5-Msample/s Low-Spurious CMOS ADC", *IEEE J. Solid-State Circ.*, pp. 1866–1875, Vol. 32, No. 12, December 1997, IEEE.

[5] B. Razavi, "Design of Analog CMOS Integrated Circuits", McGraw-Hill, pp. 361–388.

What is claimed is:

1. An A/D converter background calibration method of the skip-and-fill type, including the steps of tracking operating condition changes; and adapting background calibration skip rate to A/D converter operating conditions change rare.

2. The method of claim 1, including the steps of determining a measure representing a change in at least one operating condition parameter:

increasing said skip rate if said measure exceeds a predetermined change threshold; and decreasing said skip rate if said measure falls below said change 15 threshold.

3. The method of claim 1, including the steps of determining a measure representing a change in at least one operating condition parameter;

increasing said skip rate if said measure exceeds a first predetermined threshold; and decreasing said skip rate if said measure falls below a second predetermined threshold.

4. The method of claim 2, wherein said determining step is repeatedly performed.

5. The method of claim 4, including the step of increasing said skip rate as long as said measure exceeds said change threshold until a maximum skip rate is reached.

6. The method of claim 4, including the step of decreasing said skip rate as long as said measure does not exceed said change threshold until a minimum ski 3.te is reached.

7. The method of claim 3, wherein said determining step is repeatedly performed.

8. The method of claim 7, including the step of increasing said skip rate as long as said measure exceeds said first threshold until a maximum skip rate is reached.

9. The method of claim 7, including the step of decreasing said skip rate as long as said measure falls below said second threshold until a minimum skip rate is reached.

10. The method of claim 1, including the steps of
   determining a measure representing a change rate in at least one operating condition parameter; and
   determining a new background calibration skip rate by evaluating a function of said measure.

11. An A/D converter background calibration apparatus of the skip-and-fill type, including
   means for tracking operating condition changes; and
   means for adapting background calibration skip rate to A/D converter operating conditions change rate.

12. The apparatus of claim 11, including
   means for determining a measure representing a change in at least one operating condition parameter;
   means for increasing said skip rate if said measure exceeds a predetermined change threshold; and
   means for decreasing said skip rate if said measure fails below said change threshold.

13. The apparatus of claim 11, including
   means for determining a measure representing a change in at least one operating condition parameter;
   means for increasing said skip rate if said measure exceeds a first predetermined threshold; and
   means for decreasing said skip rate if said measure falls below a second 10 predetermined threshold.

14. The apparatus of claim 12, including means for repeatedly performing said determining step.

15. The apparatus of claim 14, including means for increasing said skip rate as long as said measure exceeds said change threshold until a maximum skip rate is reached.

16. The apparatus of claim 14, including means for decreasing said skip rate as long as said measure does not exceed said change threshold until a minimum skip rate is reached.

17. The apparatus of claim 13, including means for repeatedly performing said determining step.

18. The apparatus of claim 17, including means for increasing said skip rate as long as said measure exceeds said first threshold until a maximum skip rate is reached.

19. The apparatus of claim 17, including means for decreasing said skip rate as long as said measure fails below said second threshold until a minimum skip rate is reached.

20. The apparatus of claim 11, including
   means for determining a measure representing a change rate in at least one operating condition parameter; and
   means for determining a new background calibration skip rate by evaluating a function of said measure.

* * * * *